United States Patent
Raring et al.

(10) Patent No.: US 9,099,843 B1
(45) Date of Patent: Aug. 4, 2015

(54) HIGH OPERATING TEMPERATURE LASER DIODES

(71) Applicant: SORAA, INC., Fremont, CA (US)

(72) Inventors: James W. Raring, Goleta, CA (US); Hua Huang, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 139 days.

(21) Appl. No.: 13/937,358

(22) Filed: Jul. 9, 2013

Related U.S. Application Data (60) Provisional application No. 61/673,652, filed on Jul. 19, 2012.

(51) Int. Cl.
| | |
|---|---|
| *H01S 5/343* | (2006.01) |
| *H01S 5/32* | (2006.01) |
| *H01S 5/22* | (2006.01) |
| *H01S 5/30* | (2006.01) |

(52) U.S. Cl.
CPC .......... *H01S 5/34333* (2013.01); *H01S 5/2201* (2013.01); *H01S 5/3202* (2013.01); *H01S 5/22* (2013.01); *H01S 5/2206* (2013.01); *H01S 5/305* (2013.01)

(58) Field of Classification Search
CPC ....... H01S 5/22; H01S 5/2201; H01S 5/2206; H01S 5/2216; H01S 5/3013; H01S 5/305; H01S 5/3202
USPC ...................................... 372/45.01
See application file for complete search history.

(56) References Cited

U.S. PATENT DOCUMENTS

| | | | |
|---|---|---|---|
| 4,318,058 A | 3/1982 | Mito et al. | |
| 5,821,555 A * | 10/1998 | Saito et al. | ............ 257/13 |
| 6,069,394 A | 5/2000 | Hashimoto et al. | |
| 6,379,985 B1 | 4/2002 | Cervantes et al. | |
| 6,639,925 B2 | 10/2003 | Niwa et al. | |
| 6,680,959 B2 | 1/2004 | Tanabe et al. | |
| 6,833,564 B2 | 12/2004 | Shen et al. | |
| 6,858,882 B2 | 2/2005 | Tsuda et al. | |
| 7,470,555 B2 | 12/2008 | Matsumura | |
| 7,483,468 B2 | 1/2009 | Tanaka | |
| 7,555,025 B2 | 6/2009 | Yoshida | |
| 7,691,658 B2 | 4/2010 | Kaeding et al. | |
| 7,709,284 B2 | 5/2010 | Iza et al. | |
| 7,939,354 B2 | 5/2011 | Kyono et al. | |
| 7,968,864 B2 | 6/2011 | Akita et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Abare, 'Cleaved and Etched Facet Nitride Laser Diodes', IEEE Journal of Selected Topics in Quantum Electronics, vol. 4, No. 3, 1998, pp. 505-509.

(Continued)

*Primary Examiner* — Xinning Niu
(74) *Attorney, Agent, or Firm* — Kilpatrick Townsend & Stockton LLP (57) ABSTRACT

Methods and devices configured to operate at high temperatures using semi-polar oriented gallium and nitrogen containing substrates for optical applications are disclosed.

27 Claims, 4 Drawing Sheets

(56) References Cited

U.S. PATENT DOCUMENTS

| | | | |
|---|---|---|---|
| 8,126,024 | B1 | 2/2012 | Raring |
| 8,242,522 | B1 | 8/2012 | Raring |
| 8,254,425 | B1 | 8/2012 | Raring |
| 8,259,769 | B1 | 9/2012 | Raring et al. |
| 8,284,810 | B1 | 10/2012 | Sharma et al. |
| 8,294,179 | B1 | 10/2012 | Raring |
| 8,351,478 | B2 | 1/2013 | Raring et al. |
| 8,355,418 | B2 | 1/2013 | Raring et al. |
| 8,416,825 | B1 | 4/2013 | Raring |
| 8,422,525 | B1 | 4/2013 | Raring et al. |
| 2001/0048114 | A1 | 12/2001 | Morita et al. |
| 2002/0085603 | A1 | 7/2002 | Okumura |
| 2002/0105986 | A1 | 8/2002 | Yamasaki |
| 2003/0012243 | A1 | 1/2003 | Okumura |
| 2003/0216011 | A1 | 11/2003 | Nakamura et al. |
| 2004/0151222 | A1 | 8/2004 | Sekine |
| 2004/0247275 | A1 | 12/2004 | Vakhshoori et al. |
| 2005/0040384 | A1 | 2/2005 | Tanaka et al. |
| 2005/0072986 | A1 | 4/2005 | Sasaoka |
| 2005/0168564 | A1 | 8/2005 | Kawaguchi et al. |
| 2005/0224826 | A1 | 10/2005 | Keuper et al. |
| 2005/0230701 | A1 | 10/2005 | Huang |
| 2005/0286591 | A1 | 12/2005 | Lee |
| 2006/0078022 | A1 | 4/2006 | Kozaki et al. |
| 2006/0193359 | A1 | 8/2006 | Kuramoto |
| 2006/0213429 | A1 | 9/2006 | Motoki et al. |
| 2006/0288928 | A1 | 12/2006 | Eom et al. |
| 2007/0081857 | A1 | 4/2007 | Yoon |
| 2007/0110112 | A1 | 5/2007 | Sugiura |
| 2007/0217462 | A1 | 9/2007 | Yamasaki |
| 2007/0242716 | A1 | 10/2007 | Samal et al. |
| 2007/0272933 | A1 | 11/2007 | Kim et al. |
| 2008/0095492 | A1* | 4/2008 | Son et al. .................. 385/14 |
| 2008/0191223 | A1 | 8/2008 | Nakamura et al. |
| 2008/0198881 | A1 | 8/2008 | Farrell et al. |
| 2008/0232416 | A1 | 9/2008 | Okamoto et al. |
| 2008/0285609 | A1* | 11/2008 | Ohta et al. .............. 372/44.011 |
| 2008/0291961 | A1 | 11/2008 | Kamikawa et al. |
| 2008/0298409 | A1 | 12/2008 | Yamashita et al. |
| 2008/0308815 | A1 | 12/2008 | Kasai et al. |
| 2008/0315179 | A1 | 12/2008 | Kim et al. |
| 2009/0058532 | A1 | 3/2009 | Kikkawa et al. |
| 2009/0061857 | A1 | 3/2009 | Kazmi |
| 2009/0078944 | A1 | 3/2009 | Kubota et al. |
| 2009/0080857 | A1 | 3/2009 | St. John-Larkin |
| 2009/0081857 | A1 | 3/2009 | Hanser et al. |
| 2009/0141765 | A1 | 6/2009 | Kohda et al. |
| 2009/0267100 | A1 | 10/2009 | Miyake et al. |
| 2009/0310640 | A1 | 12/2009 | Sato et al. |
| 2010/0096615 | A1 | 4/2010 | Okamoto et al. |
| 2010/0276663 | A1 | 11/2010 | Enya et al. |
| 2010/0295054 | A1 | 11/2010 | Okamoto et al. |
| 2010/0309943 | A1 | 12/2010 | Chakraborty et al. |
| 2010/0316075 | A1 | 12/2010 | Raring et al. |
| 2011/0031508 | A1 | 2/2011 | Hamaguchi et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0103418 | A1 | 5/2011 | Hardy et al. |
| 2011/0164637 | A1 | 7/2011 | Yoshizumi et al. |
| 2011/0216795 | A1 | 9/2011 | Hsu et al. |
| 2011/0286484 | A1 | 11/2011 | Raring et al. |
| 2012/0104359 | A1 | 5/2012 | Felker et al. |
| 2013/0044782 | A1 | 2/2013 | Raring |

FOREIGN PATENT DOCUMENTS

| | | |
|---|---|---|
| CN | 1702836 | 11/2005 |
| CN | 1781195 | 5/2006 |
| CN | 101099245 | 1/2008 |
| CN | 101171692 | 4/2008 |
| CN | 101079463 | 9/2009 |
| WO | WO 2004/084275 | 9/2004 |
| WO | WO 2008/041521 | 4/2008 |

OTHER PUBLICATIONS

Adesida et al., 'Characteristics of chemically assisted ion beam etching of gallium nitride', Applied Physics Letters, vol. 65, No. 7, 1994, pp. 889-891.

Behfar et al., 'Progress in Etched Facet Technology for GaN and Blue Lasers', Proc. of SPIE., vol. 6473, 64731F, 2007, pp. 1-8.

Feezell et al. 'Development of nonpolar and semipolar InGaN/GaN visible light-emitting diodes', MRS Bulletin, vol. 34, May 2009, pp. 318-323.

Khan, 'Cleaved Cavity Optically Pumped InGaN-GaN Laser Grown on Spinel Substrates', Applied Physics Letters, vol. 69, No. 16, 1996, pp. 2417-2420.

Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, pp. 7032-7035.

Okamoto et al., 'Continuous-Wave Operation of m-Plane InGaN Multiple Quantum Well Laser Diodes', Japanese Journal of Applied Physics, vol. 46, No. 9, 2007, pp. L187-L189.

Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, pp. 072201-1-072201-3.

Park, 'Crystal Orientation Effects on Electronic Properties of Wurtzite InGaN/GaN Quantum Wells', Journal of Applied Physics, vol. 91, No. 12, 2002, pp. 9903-9908.

International Search Report of PCT Application No. PCT/US2010/030939, dated Jun. 16, 2010, 9 pages total.

International Preliminary Report & Written Opinion of PCT Application No. PCT/US2011/037792, dated Dec. 6, 2012, 8 pages total.

Romanov et al., 'Strain-Induced Polarization in Wurtzite III-Nitride Semipolar Layers', Journal of Applied Plysics, vol. 100, 2006, pp. 023522-1 through 023522-10.

Schoedl, 'Facet Degradation of GaN Heterostructure Laser Diodes', Journal of Applied Physics, vol. 97, issue 12, 2006, pp. 123102-1-123102-8.

Tyagi et al., 'Semipolar (1011) InGaN/GaN Laser Diodes on Bulk GaN Substrates', Japanese Journal of Applied Physics, vol. 46, No. 19, 2007, pp. L444-L445.

Communication from the Chinese Patent Office re 200980134723.8 dated Jun. 27, 2013, 19 pages.

Zhong et al., 'Demonstration of High Power Blue-Green Light Emitting Diode on Semipolar (1122) Bulk GaN Substrate', Electronics Letters, vol. 43, No. 15, 2007, pp. 825-826.

USPTO Office Action for U.S. Appl. No. 12/502,058 dated Dec. 8, 2010, 15 pages.

USPTO Office Action for U.S. Appl. No. 12/502,058 dated Aug. 19, 2011, 13 pages.

USPTO Notice of Allowance for U.S. Appl. No. 12/502,058 dated Apr. 16, 2012, 10 pages.

USPTO Notice of Allowance for U.S. Appl. No. 12/502,058 dated Jul. 19, 2012, 13 pages.

USPTO Office Action for U.S. Appl. No. 12/534,838 dated May 3, 2011, 12 pages.

USPTO Office Action for U.S. Appl. No. 12/534,838 dated Jan. 13, 2012, 14 pages.

USPTO Office Action for U.S. Appl. No. 12/534,838 dated Mar. 20, 2012, 13 pages.

USPTO Notice of Allowance for U.S. Appl. No. 12/534,838 dated Jun. 8, 2012, 8 pages.

USPTO Office Action for U.S. Appl. No. 12/749,466 dated Jun. 29, 2011, 20 pages.

USPTO Office Action for U.S. Appl. No. 12/749,466 dated Feb. 3, 2012, 16 pages.

USPTO Office Action for U.S. Appl. No. 12/749,466 dated Jul. 3, 2012, 18 pages.

USPTO Notice of Allowance for U.S. Appl. No. 12/749,466 dated Jan. 2, 2013, 8 pages.

(56) References Cited

OTHER PUBLICATIONS

USPTO Office Action for U.S. Appl. No. 12/759,273 dated Nov. 21, 2011, 10 pages.
USPTO Office Action for U.S. Appl. No. 12/759,273 dated Jun. 26, 2012, 10 pages.
USPTO Office Action for U.S. Appl. No. 12/762,269 dated Oct. 12, 2011, 12 pages.
USPTO Notice of Allowance for U.S. Appl. No. 12/762,269 dated Apr. 23, 2012, 8 pages.
USPTO Office Action for U.S. Appl. No. 12/762,271 dated Dec. 23, 2011, 12 pages.
USPTO Office Action for U.S. Appl. No. 12/762,271 dated Jun. 6, 2012, 13 pages.
USPTO Notice of Allowance for U.S. Appl. No. 12/762,271 dated Aug. 8, 2012, 9 pages.
USPTO Notice of Allowance for U.S. Appl. No. 12/762,278 dated Nov. 7, 2011, 11 pages.
USPTO Office Action for U.S. Appl. No. 12/778,718 dated Nov. 25, 2011, 12 pages.
USPTO Notice of Allowance for U.S. Appl. No. 12/778,718 dated Apr. 3, 2012, 14 pages.
USPTO Notice of Allowance for U.S. Appl. No. 12/778,718 dated Jun. 13, 2012, 7 pages.
USPTO Office Action for U.S. Appl. No. 12/868,441 dated Apr. 30, 2012, 12 pages.
USPTO Office Action for U.S. Appl. No. 12/868,441 dated Dec. 18, 2012, 34 pages.
USPTO Notice of Allowance for U.S. Appl. No. 12/868,441 dated Sep. 18, 2013, 13 pages.
USPTO Office Action for U.S. Appl. No. 12/883,093 dated Mar. 13, 2012, 10 pages.
USPTO Office Action for U.S. Appl. No. 12/883,093 dated Aug. 3, 2012, 13 pages.
USPTO Notice of Allowance for U.S. Appl. No. 12/883,093 dated Nov. 21, 2012, 12 pages.
USPTO Office Action for U.S. Appl. No. 12/884,993 dated Mar. 16, 2012, 13 pages.
USPTO Office Action for U.S. Appl. No. 12/884,993 dated Aug. 2, 2012, 15 pages.
USPTO Notice of Allowance for U.S. Appl. No. 12/884,993 dated Nov. 26, 2012, 5 pages.
USPTO Office Action for U.S. Appl. No. 13/114,806 dated Apr. 12, 2013, 22 pages.
USPTO Office Action for U.S. Appl. No. 13/114,806 dated Aug. 26, 2013, 22 pages.
USPTO Office Action for U.S. Appl. No. 13/291,922 dated Feb. 20, 2013, 10 pages.
USPTO Office Action for U.S. Appl. No. 13/291,922 dated Jun. 18, 2013, 9 pages.
USPTO Office Action for U.S. Appl. No. 13/354,639 dated Nov. 7, 2012, 9 pages.
USPTO Notice of Allowance for U.S. Appl. No. 13/354,639 dated Dec. 14, 2012, 8 pages.

* cited by examiner

HIGH OPERATING TEMPERATURE LASER DIODES

This application claims benefit under 35 U.S.C. §119(e) of U.S. Provisional Application No. 61/673,652 filed on Jul. 19, 2012, which is incorporated by reference in its entirety.

BACKGROUND

The present invention generally relates to optical techniques. More specifically, the present invention provides methods and devices configured to operate at high temperatures using semi-polar oriented gallium and nitrogen containing substrates for optical applications.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties, which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above it can be appreciated that techniques for improving optical devices is highly desired.

SUMMARY

According to the present invention, techniques related generally to optical devices are provided. More particularly, the present invention provides methods and devices for emitting electromagnetic radiation using semipolar or non-polar gallium containing substrates such as GaN, MN, InN, InGaN, AlGaN, and AlInGaN, and others. Merely by way of example, the invention can be applied to the non-polar m-plane or to the semipolar (11-22), (30-31), (30-3-1), (20-21), (20-2-1), (30-32), or (30-3-2) planes, or offcuts thereof. Merely by way of example, the invention can be applied to optical devices, lasers, light emitting diodes, solar cells, photoelectrochemical water splitting and hydrogen generation devices, photodetectors, integrated circuits, and transistors, among other devices. In a specific embodiment, the present laser device can be employed in either a semipolar or non-polar gallium containing substrate, as described below. Laser diodes according to this invention can offer improved efficiency, cost, temperature sensitivity, and ruggedness over lasers based on SHG technology. Moreover, laser diodes according to this invention can provide an output with a spectral linewidth of 0.5 nm to 2 nm, which is advantageous in display applications where speckle must be considered.

In a specific embodiment, the present invention provides an optical device. The device includes a gallium and nitrogen containing substrate member having a semipolar crystalline surface region. The gallium and nitrogen containing substrate member can be characterized by a surface dislocation density of less than $10^5$ cm$^{-2}$ and a stacking fault density of less than $10^3$ cm$^{-1}$. The device has an offcut characterizing the surface region. The device has a gallium and nitrogen containing n-type cladding layer overlying the surface region. The n-type cladding layer has a thickness and an n-type doping level of 5E16 cm$^{-3}$ to 6E18 cm$^{-3}$. The device has an n-side separate confining heterostructure (SCH) waveguide layer overlying the n-type cladding layer, the n-side SCH waveguide layer comprising at least gallium, indium, and nitrogen with a molar fraction of InN of greater than 1% and having a thickness greater than 15 nm. The device has a multiple quantum well active region overlying the n-side SCH waveguide layer. The device has a multiple quantum well active region comprised of two to six, 1.5 nm to 8.5 nm thick InGaN quantum wells separated by gallium and nitrogen containing barrier layers. The device has a p-type gallium and nitrogen containing cladding layer overlying the multiple quantum well active region. The p-type cladding layer has a thickness from 200 nm to 1500 nm with a p-type doping level of 5E16 cm$^{-3}$ to 5E19 cm$^{-3}$. The device has a p++ gallium and nitrogen containing contact layer overlying the p-type cladding layer. The p++ gallium and nitrogen containing contact layer has a thickness greater than 5 nm with a p-type doping level of 1E19 cm$^{-3}$ to 1E22 cm$^{-3}$, and at least one waveguide member. The at least one waveguide member is aligned substantially in a projection of the c-direction. The waveguide region comprises of a first end and a second end.

Current state-of-the-art commercially available blue laser diodes with output powers of above 1 W operate at a nominal operating current in the 1-2 A range. With the transition from foreign to native substrates to reduce the dislocation density to below 1E6 $cm^{-2}$, improvements in epitaxial growth and device processes, and advances in facet passivation technology, such high power blue laser diodes now offer lifetimes of ~100 khrs at 25° C. (defined as 50% power drop at a fixed current) and 20 khrs and 50° C. base temperature according to published product specification sheets and literature.

The well-known Arrhenius formula provides a way to look at the dependence of lifetime on temperature, $$\text{Lifetime}(T_j) = \text{Lifetime}(T_0) * \text{EXP}\left(-\frac{E_a}{kT_j}\right)$$

where $E_a$ is the activation energy, $T_j$ is the laser diode junction temperature, and k is the Boltzmann constant. With a minimum of two lifetime values at various temperatures available the activation energy can be extracted. With a known activation energy the lifetime at other temperatures of interest can be calculated on the condition that no new failure mechanisms will be initiated at these alternate temperatures. By using this formula we compute an activation energy of 0.73 eV for state of the art high power blue laser diodes. Based on this activation energy, the lifetime MTTF expectancy at a 70° C. base temperature is only 6.4 khrs, and drops further to only 1.4 khrs at a 100° C. base temperature, which are shown as the solid lines in FIG. 4. Such short lifetimes will not be highly suitable for many applications.

Figure 4:
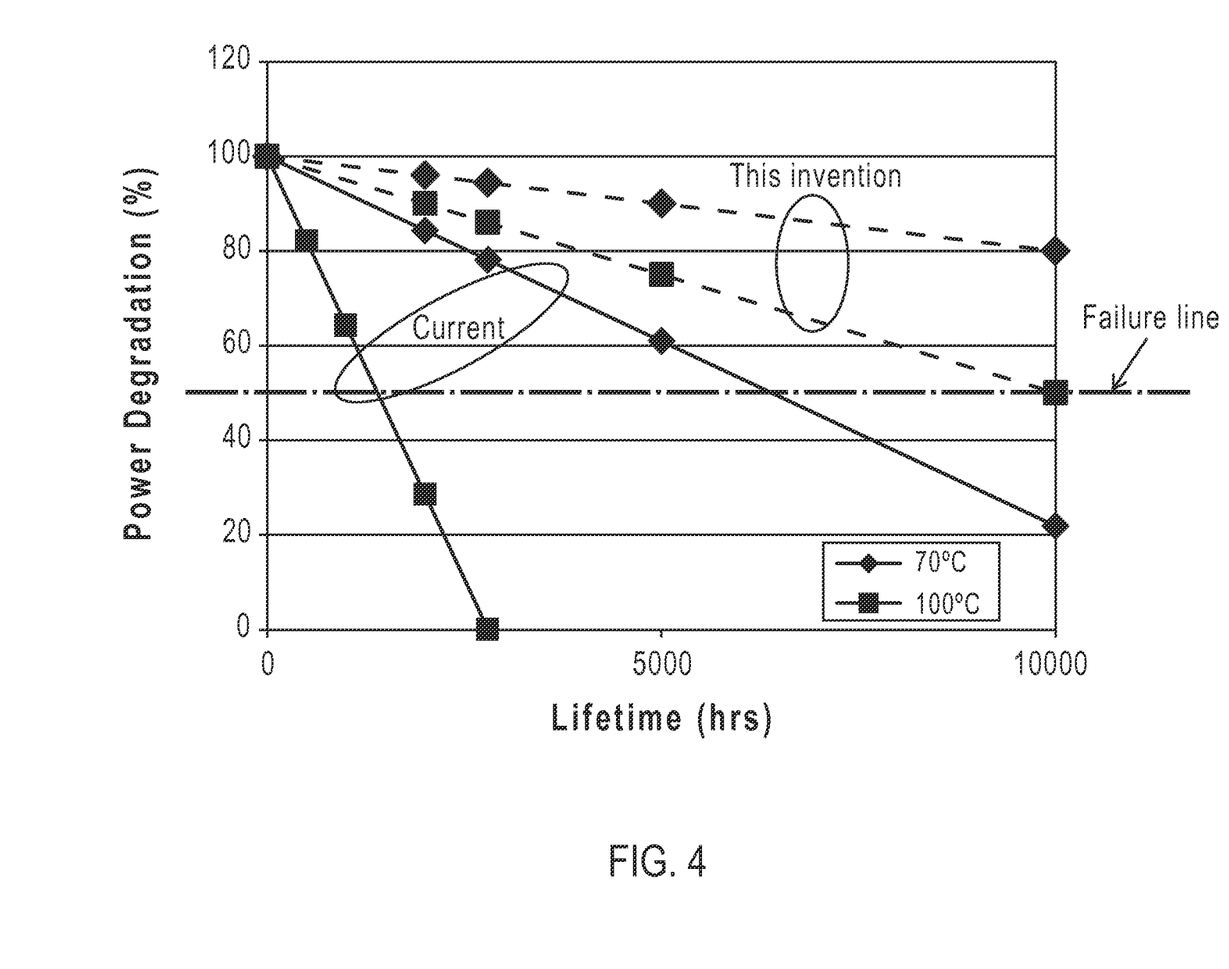
FIG. 4 shows examples of lifetime comparison between current state of the art laser chips and laser chips according to this invention. Solid lines represent current state-of-the-art LDs fabricated on substrates with dislocation densities of $10^5$ $cm^{-2}$ to $10^6$ $cm^{-2}$ showing lifetimes of −6.4 khrs at 70° C. (defined as 50% power drop at a fixed current) and 1.4 khrs at 100° C. base temperature while dashed lines represent laser diodes fabricated on ultra-low defect density substrates according to this invention achieving lifetimes of about 25 khrs at 70° C. and 10 khrs at 100° C. base temperature.

One potential driving force for the steady degradation observed in these commercially available blue laser diodes can be attributed to dislocations present in the native substrate, which propagate to the active region and lead to increased non-radiative recombination. Such substrate dislocation densities of presently available bulk GaN substrates range up to $10^6$ $cm^{-2}$ and higher. By fabricating laser diodes on native gallium and nitrogen containing substrates with very low dislocation density and stacking fault density the lifetime of the lasers will be significantly improved and allow them to operate at higher temperatures. The dashed lines in FIG. 4 provide possible aging curves of laser diodes according to this invention with estimated lifetimes of and 25 khrs at 70° C. and 10 khrs at 100° C. base temperature. Such an improvement in lifetime at elevated temperatures will enable use the laser diodes in new applications.

The present invention achieves these benefits and others in the context of known process technology. A further understanding of the nature and advantages of the present invention may be realized by reference to the latter portions of the specification and attached drawings.

DETAILED DESCRIPTION

According to the present invention, techniques related generally to optical devices are provided. More particularly, the present invention provides a method and device for emitting electromagnetic radiation using semipolar or non-polar gallium containing substrates such as GaN, MN, InN, InGaN, AlGaN, and AlInGaN, and others. Merely by way of example the invention can be applied to the non-polar m-plane or to the semipolar (11-22), (30-31), (30-3-1), (20-21), (20-2-1), (30-32), or (30-3-2) planes, or offcuts thereof. Merely by way of example, the invention can be applied to optical devices, lasers, light emitting diodes, solar cells, photoelectrochemical water splitting and hydrogen generation devices, photodetectors, integrated circuits, and transistors, among other devices. In a specific embodiment, the present laser device can be employed in either a semipolar or non-polar gallium containing substrate, as described below. Laser diodes according to this invention can offer improved efficiency, cost, temperature sensitivity, and ruggedness over lasers based on SHG technology. Moreover, laser diodes according to this invention can provide an output with a spectral linewidth of 0.5 nm to 2 nm, which is advantageous in display applications where speckle must be considered.

Visible laser diodes based on gallium and nitrogen containing substrates are fueling massive growth in display applications deploying laser diodes as light sources. This explosion in demand for laser diodes is expected to continue as next generation TV based on lasers and specialty lighting applications emerge. Automotive lighting is an example of specialty lighting that is already under intense development. Many of these existing and emerging applications would greatly benefit from laser diodes that could be driven to substantially higher current densities or operated at substantially higher junction temperatures than current state of the art GaN based lasers while still maintaining a long lifetime. An example where higher current density would be extremely beneficial would be in applications that require several watts (2-30 W) of blue or green light. Currently such applications are served by the coupling several laser diodes operating in the 1-3 W range to achieve the total required power. If the individual lasers could be driven at 1.5-2 times the current substantially more output power could be achieved at nearly an identical cost. This would result in a lower total cost of laser components in the final product along with potentially simpler and cheaper system design benefitting the end consumer with a lower product cost. High junction temperature operation would be highly beneficial in both display and specialty light applications. A potentially large market segment in display applications is projection displays for education purposes in warm weather climates. In this application the case temperatures can exceed 70° C. such that the junction temperatures would be between 80° C. and 100° C. for standard packaging, but the reliability must be high. State of the art commercially available high power laser diodes operating with over 1 W of output power at a 70° C. case temperature typically exhibit a mean time to failure (MTTF) of less than 10 khrs with failure defined as the time it takes for the power to decrease to ½ of that of the power at t=0. If the MTTF at a case temperature of 70° C. can reach 25 khrs, 50 khrs, or even 100 khrs the product would provide much greater value to the consumer. Automotive applications can require even more extreme environmental conditions with engine compartments reaching over 120 C. Compounding the challenge of such an extreme ambient temperature is the strict reliability requirements of the automotive industry. There are currently no known commercially available GaN based laser diodes that can offer reasonable lifetimes of over 10 khrs with any substantial output power at such temperatures.

Many factors play into the lifetime or reliability of laser diodes including the quality of the substrate, quality of the epitaxial material grown on the substrate, the fabrication process, the materials selected for the processing such as etch chemistries, metals, and dielectrics, the facet or mirror quality and treatments, and the packaging. At the core of all of these mentioned considerations is the substrate quality. For homoepitaxy where GaN based devices are grown on native substrates the epitaxial material quality will be largely dictated by the quality of the substrate. The epitaxial material will in turn dictate the potential performance and efficiency of the laser diode. Thus, high-quality low-defect-density substrates are of paramount importance to the realization of high-performance and highly reliable laser diodes, especially under extreme conditions with high ambient temperatures.

Figure 3:
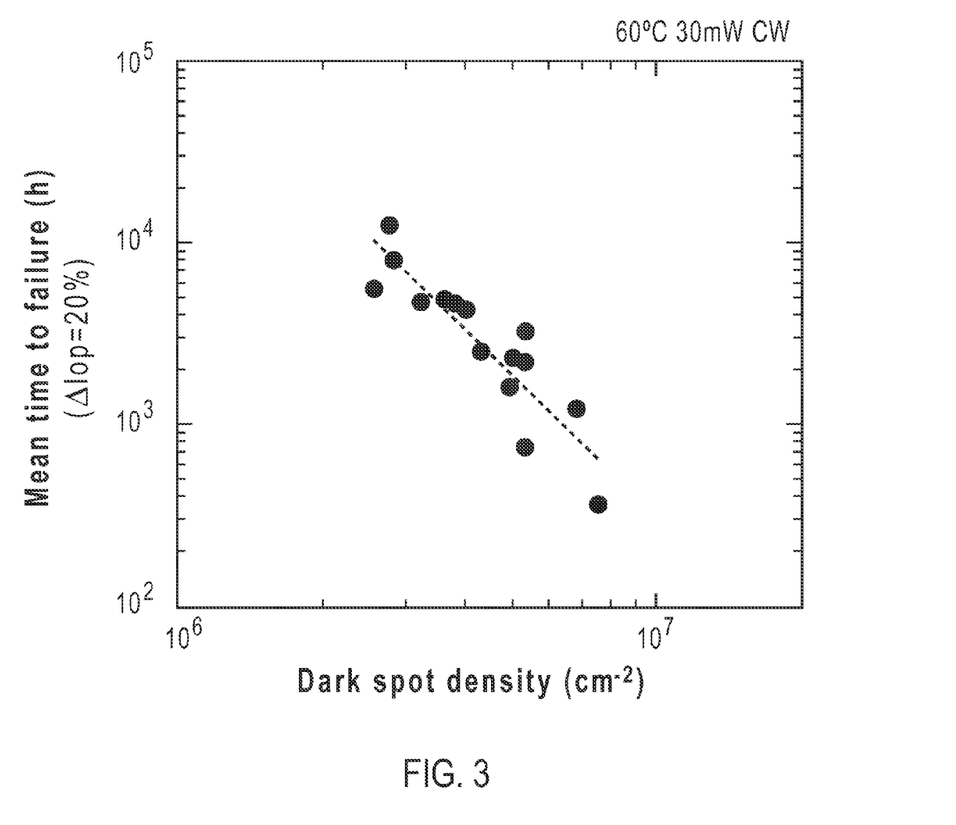
FIG. 3 is a plot taken from the literature (Tomiya et al., IEEE JSTQE, Vol. 10, No. 6, November/December 2004) showing the MTTF lifetime versus dislocation dark spot density for laser devices operating with 30 mW of output power at a 60° C. case temperature where failure is defined as the time it takes for the operating current to increase by 20%.

It is well known that dislocation density has a large impact on the lifetime of GaN based laser diodes. In fact, prior to the availability of free-standing GaN substrates when lasers were manufactured on foreign substrates such as sapphire or silicon carbide the largest challenge was achieving a reasonable lifetime with all efforts aimed at reducing the dislocation density resulting from the mismatched interface between the epitaxy and the substrate. It was not until the dislocation density in the vicinity of the laser diode was reduced to below $1E7 \text{ cm}^{-2}$. FIG. 3 is a plot taken from literature showing the MTTF lifetime versus dislocation dark spot density for laser devices operating with 30 mW of output power at a 60° C. case temperature where failure is defined as the time it takes for the operating current to increase by 20%. As shown in FIG. 3, the MTTF increases from about 1 khr to about 10 khr when the dislocation density is reduced from $1E7 \text{ cm}^{-2}$ to $3E6$ $\text{cm}^{-2}$. This dramatic MTTF dependence on dislocation density illustrates the importance of high quality substrates for achieving long lifetime laser diodes at high temperature or high current density operation.

Most commercially available free-standing gallium and nitrogen containing substrate material (e.g., bulk GaN substrates) are formed with hydride vapor epitaxy techniques (HVPE) techniques. There are several variants of this method with relation to the growth reactors, the growth conditions, and the starting seed material. Examples of seed material include, for example, sapphire, GaAs, GaN templates, and bulk GaN. Use of these currently commercially available substrates typically result in dislocation densities of between $1E5 \text{ cm}^{-2}$ to $1E7 \text{ cm}^{-2}$ and can have stacking fault densities that range from 0 to $1E5 \text{ cm}^{-1}$. New substrate synthesis techniques such as ammonothermal-based growth or HVPE growth with extremely high quality seeds can potentially reduce the dislocation density to below $1E5 \text{ cm}^2$, below $1E3$ $\text{cm}^{-2}$, or eventually even below $1E1 \text{ cm}^{-2}$. With the availability of such very low defect density substrates and through optimization of the epitaxy and laser process it will be possible to achieve extremely high lifetimes in GaN based laser diodes at conventional case temperatures of 25° C. to 50° C. and high reliability at extreme case temperatures such as above 70° C. and above 100° C.

Figure 1:
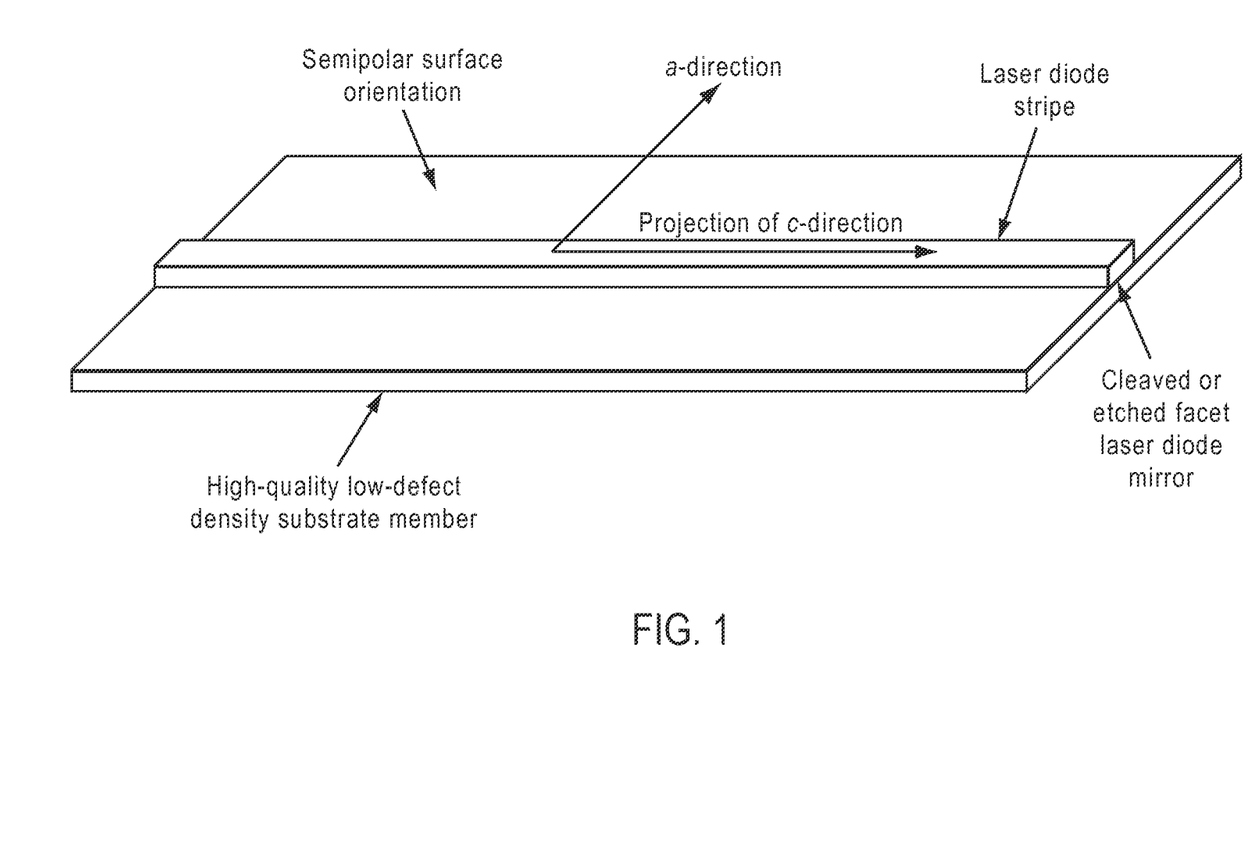
FIG. 1 is a simplified perspective view of a laser device fabricated on a semipolar or nonpolar substrate according to embodiments of the present invention.

FIG. 1 is a simplified perspective view of a laser device fabricated on a semipolar or nonpolar substrate according to an embodiment of the present invention. As shown, the optical device includes a gallium and nitrogen containing substrate member having a semipolar or non-polar crystalline surface region. In a specific embodiment, the gallium and nitrogen containing substrate is a bulk GaN substrate characterized by having a semipolar or non-polar crystalline surface region, but can be others. In a specific embodiment, the bulk GaN substrate comprises nitrogen and has a surface dislocation density below $10^5 \text{ cm}^{-2}$ or $10^3 \text{ cm}^{-2}$. In a specific embodiment, the bulk nitride GaN substrate comprises nitrogen and has a stacking fault density of below $10^2 \text{ cm}^{-1}$ or $10^0$ $\text{cm}^{-1}$. The nitride crystal or wafer may comprise $Al_xIn_yGa_{1-x-y}N$, where $0 \leq x, y, x+y \leq 1$. In one specific embodiment, the nitride crystal comprises GaN. In a specific embodiment, the device can be fabricated on a slightly off-cut semipolar substrate as described in U.S. Pat. No. 8,422,525, which is incorporated by reference in its entirety.

In a specific embodiment on nonpolar GaN, the device has a laser stripe region formed overlying a portion of the semi or non-polar crystalline orientation surface region. The laser stripe region is characterized by a cavity orientation, which is substantially parallel to the c-direction or the projection of the c-direction. The laser stripe region has a first end and a second end. Typically, the non-polar crystalline orientation is configured on an m-plane, which leads to polarization ratios parallel to the a-direction. In some embodiments, the m-plane is the (10-10) family. The cavity orientation can also be substantially parallel to the a-direction as well. In the specific non-polar GaN embodiment having the cavity orientation substantially parallel to the c-direction is further described in U.S. Application Publication No. 2010/0316075, which is incorporated by reference in its entirety.

In certain semipolar embodiments, the device has a first cleaved semipolar facet provided on the first end of the laser stripe region and a second cleaved semipolar facet provided on the second end of the laser stripe region. The first cleaved semipolar facet is substantially parallel with the second cleaved semipolar facet. In a specific embodiment, the semipolar substrate is configured on a (30-31), (30-3-1), (20-21), (20-2-1), (30-32), (30-3-2) or offcut. The laser waveguide cavity is aligned in the projection of the c-direction. Mirror surfaces are formed on each of the cleaved surfaces. The first cleaved semipolar facet comprises a first mirror surface, typically provided by a scribing and breaking process. The scribing process can use any suitable technique, such as a diamond scribe or laser scribe or combinations. In a specific embodiment, the first mirror surface comprises a reflective coating. The reflective coating is selected from silicon dioxide, hafnia, and titania, tantalum pentoxide, zirconia, aluminum oxide, including combinations, and the like. Depending upon the embodiment, the first mirror surface can be provided by an anti-reflective coating.

Also in certain semipolar embodiments, the second cleaved semipolar facet comprises a second mirror surface. The second mirror surface can be provided by a scribing and breaking process. Preferably, the scribing is performed by diamond or laser scribing. In a specific embodiment, the second mirror surface comprises a reflective coating, such as silicon dioxide, hafnia, and titania, tantalum pentoxide, zirconia, aluminum oxide, combinations, and the like. In a specific embodiment, the second mirror surface comprises an anti-reflective coating.

In certain semipolar embodiments, the device has a first etched semipolar facet provided on the first end of the laser stripe region and a second etched semipolar facet provided on the second end of the laser stripe region. The first etched semipolar facet is substantially parallel with the second etched semipolar facet. In a specific embodiment, the semipolar substrate is configured on a (30-31), (30-3-1), (20-21), (20-2-1), (30-32), (30-3-2) or offcut. The laser waveguide cavity is aligned in the projection of the c-direction. Mirror surfaces are formed on each of the etched surfaces. The first etched semipolar facet comprises a first mirror surface, typically provided by an etching technique. The etching technique can use any suitable technique, such as a dry etch or a wet etch. Preferably the etch is a dry etch and is selected from reactive ion etching (RIE), inductively coupled plasma (ICP) etching, or chemical assisted ion beam etching (CAIBE). In a specific embodiment, the first mirror surface comprises a reflective coating. The reflective coating is selected from silicon dioxide, hafnia, and titania, tantalum pentoxide, zirconia, aluminum oxide, including combinations, and the like. Depending upon the embodiment, the first mirror surface can be provided by an anti-reflective coating.

Also in certain semipolar embodiments, the second etched semipolar facet comprises a second mirror surface. The second mirror surface can be provided by a wet or dry etching process. Preferably the etch is a dry etch and is selected from reactive ion etching (RIE), inductively coupled plasma (ICP) etching, or chemical assisted ion beam etching (CAIBE). In a specific embodiment, the second mirror surface comprises a reflective coating, such as silicon dioxide, hafnia, and titania, tantalum pentoxide, zirconia, aluminum oxide, combinations, and the like. In a specific embodiment, the second mirror surface comprises an anti-reflective coating.

In certain semipolar embodiments, the device has a first cleaved or etched m-face facet provided on the first end of the laser stripe region and a second cleaved or etched m-face facet provided on the second end of the laser stripe region. The first cleaved or etched m-facet is substantially parallel with the second cleaved or etched m-facet. In a specific embodiment, the semipolar substrate is configured on a (11-22) series of planes, enabling the formation of m-facets for laser cavities oriented in the m-direction. Mirror surfaces are formed on each of the cleaved or etched surfaces. The first cleaved or etched m-facet comprises a first mirror surface, typically provided by a scribing and breaking process or a wet or dry etching technique, respectively. The scribing process can use any suitable technique, such as a diamond scribe or laser scribe or combinations thereof. Preferably the etch is a dry etch and is selected from reactive ion etching (RIE), inductively coupled plasma (ICP) etching, or chemical assisted ion beam etching (CAIBE). In a specific embodiment, the first mirror surface comprises a reflective coating. The reflective coating is selected from silicon dioxide, hafnia, and titania, tantalum pentoxide, zirconia, aluminum oxide, including combinations, and the like. Depending upon the embodiment, the first mirror surface can be provided by an anti-reflective coating.

In certain nonpolar embodiments, the device has a first cleaved or etched c-face facet provided on the first end of the laser stripe region and a second cleaved or etched c-face facet provided on the second end of the laser stripe region. In one or more embodiments, the first cleaved or etched c-facet is substantially parallel with the second cleaved or etched c-facet. In a specific embodiment, the nonpolar substrate is configured on (10-10) series of planes, which enables the formation of c-facets for laser cavities oriented in the c-direction. Mirror surfaces are formed on each of the cleaved or etched surfaces. The first cleaved or etched c-facet comprises a first mirror surface. In certain embodiments, the first mirror surface is provided by a scribing and breaking process or a wet or dry etching process. The scribing process can use any suitable techniques, such as a diamond scribe or laser scribe or combinations thereof. Preferably the etch is a dry etch and is selected from reactive ion etching (RIE), inductively coupled plasma (ICP) etching, or chemical assisted ion beam etching (CAIBE). In a specific embodiment, the first mirror surface comprises a reflective coating. The reflective coating is selected from silicon dioxide, hafnia, and titania, tantalum pentoxide, zirconia, aluminum oxide including combinations, and the like. Depending upon the embodiment, the first mirror surface can also comprise an anti-reflective coating.

Also in certain nonpolar embodiments, the second cleaved or etched c-facet comprises a second mirror surface. The second mirror surface can be provided by a scribing and breaking process, for example, diamond or laser scribing or the like. The second mirror surface can be provided by an etching process, for example, wet or dry etching. Preferably the etch is a dry etch and is selected from reactive ion etching (RIE), inductively coupled plasma (ICP) etching, or chemical assisted ion beam etching (CAIBE). In a specific embodiment, the second mirror surface comprises a reflective coating, such as silicon dioxide, hafnia, and titania, tantalum pentoxide, zirconia, aluminum oxide, combinations, and the like. In a specific embodiment, the second mirror surface comprises an anti-reflective coating.

In a specific embodiment, the laser stripe has a length and width. The length ranges from about 50 microns to about 3000 microns. The stripe also has a width ranging from about 0.5 microns to about 50 microns, but can be other dimensions. In a specific embodiment, the width is substantially constant in dimension, although there may be slight variations. The width and length are often formed using a masking and etching process, such as commonly used in the art.

In a specific nonpolar embodiment, the device is also characterized by a spontaneously emitted light that is polarized parallel to the a-direction. That is, the device performs as a laser or the like. In certain embodiments, the spontaneously emitted light is characterized by a polarization ratio of greater than about 0.1 and less than about 1 parallel to the projection of the c-direction. In certain embodiments, the spontaneously emitted light characterized by a wavelength ranging from about 425 nanometers to 470 nanometers or from about 475 nanometers to about 545 nanometers to yield a blue or blue-green or green laser or others and the spontaneously emitted light is highly polarized and is characterized by a polarization ratio parallel to the a-direction of greater than 0.5.

Figure 2:
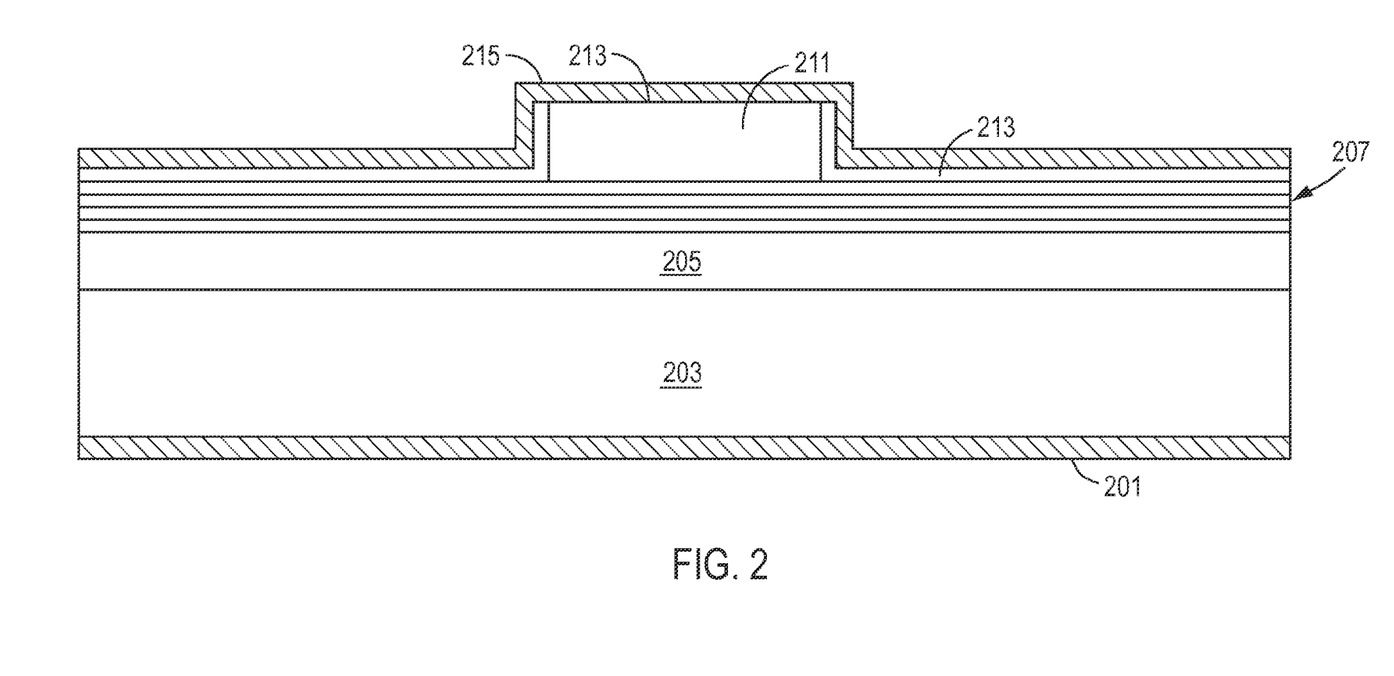
FIG. 2 is a detailed cross-sectional view of a laser device fabricated on a non-polar substrate according to embodiments of the present invention.

FIG. 2 is a detailed cross-sectional view of a laser device fabricated on a non-polar substrate according to certain embodiments of the present invention. As shown, the laser device includes gallium nitride substrate 203, which has an underlying n-type metal back contact region 201. The metal back contact region 201 can be made of a suitable material such as those noted below.

In a specific embodiment, the device also has an overlying n-type gallium nitride layer 205, an active region 207, and an overlying p-type gallium nitride layer structured as a laser stripe region 211. In a specific embodiment, each of these regions is formed using an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer 205. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 800 and about 1100 degrees Celsius in the presence of a nitrogen-containing gas. In one specific embodiment, the susceptor is heated to approximately 700 degrees Celsius to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In a specific embodiment, the laser stripe region is made of a p-type gallium and nitrogen containing layer. In a specific embodiment, the laser stripe is provided by an etching process selected from dry etching or wet etching. In certain embodiments, the etching process is dry, but other processes can be used. As an example, a dry etching process can be inductively coupled process using chlorine bearing species or a reactive ion etching process using similar chemistries. The chlorine bearing species are commonly derived from chlorine gas or the like. The device also has an overlying dielectric region, which exposes 213 contact region. In a specific embodiment, the dielectric region is an oxide such as silicon dioxide or silicon nitride. The contact region is coupled to an overlying metal layer 215. The overlying metal layer is a multilayered structure containing gold and nickel (Ni/Au), gold and palladium (Pd/Au), gold and platinum (Pt/Au), but can be others.

In a specific embodiment, the laser device has active region 207. The active region 207 can include one to twenty quantum well regions according to one or more embodiments. As an example, following deposition of the n-type $Al_uIn_vGa_{1-u-v}N$ layer for a predetermined period of time so as to achieve a predetermined thickness, an active layer is deposited. The active layer may comprise a single quantum well or a multiple quantum well, with 1-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The quantum well layers and barrier layers may each have a thickness between about 1 nm and about 40 nm. In other embodiments, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where 0≤q, r, q+r≤1, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by a dry etching process, but wet etching may also be used. The device also has an overlying dielectric region, which exposes contact region 213. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In certain embodiments, the electrical contact serves as a p-type electrode for the optical device. In another embodiment, the electrical contact serves as an n-type electrode for the optical device. Further details of the cleaved facets appear below.

In certain embodiments, the growth structure is configured using between 2 and 4 or 5 and 7 quantum wells positioned between n-type and p-type gallium and nitrogen containing cladding layers such as GaN, AlGaN, or InAlGaN. In a specific embodiment, the n-type cladding layer ranges in thickness from 500 nm to 5000 nm and has an n-type dopant such as Si with a doping level of between 1E18 cm$^{-3}$ and 3E18 cm$^{-3}$. In a specific embodiment, the p-type cladding layer ranges in thickness from 300 nm to 1000 nm and has a p-type dopant such as Mg with a doping level of between 1E17 cm$^{-3}$ and 5E19 cm$^{-3}$. In a specific embodiment, the Mg doping level is graded such that the concentration can be lower in the region closer to the quantum wells.

In certain embodiments, the quantum wells have a thickness of between 1.5 nm and 4.0 nm or 4.0 nm and 7.0 nm, but can be others. In a specific embodiment, the quantum wells would be separated by barrier layers with thicknesses between 2 nm and 8 nm or 8 nm and 22 nm. The quantum wells and the barriers together comprise a multiple quantum well (MQW) region.

In certain embodiments, the device has barrier layers formed from GaN or InGaN. In a specific embodiment using InGaN, the indium contents range from 1% to 5% (molar percent).

An InGaN separate confinement heterostructure layer (SCH) can be positioned between the n-type cladding and the MQW region according to one or more embodiments. Typically, such separate confinement layer is commonly called the n-side SCH. The n-side SCH layer ranges in thickness from 10 nm to 60 nm or 50 nm to 180 nm and ranges in indium composition from 1% to 8% (mole percent), but can be others. In a specific embodiment, the n-side SCH layer may or may not be doped with an n-type dopant such as Si.

In certain embodiments, an InGaN separate confinement heterostructure layer (SCH) is positioned between the p-type cladding layer and the MQW region, which is called the p-side SCH. In a specific embodiment, the p-side SCH layer ranges in thickness from 10 nm to 50 nm or from 50 nm to 100 nm and ranges in indium composition from 1% to 7% (mole percent), but can be others. The p-side SCH layer may or may not be doped with a p-type dopant such as Mg. In another embodiment, the structure can contain both an n-side SCH and a p-side SCH.

In certain embodiments, an AlGaN electron blocking layer, with an aluminum content of between 6% and 22% (mole percent), is positioned between the MQW and the p-type cladding layer either within the p-side SCH or between the p-side SCH and the p-type cladding. The AlGaN electron blocking layer ranges in thickness from 10 nm to 30 nm and is doped with a p-type dopant such as Mg from about 1E18 $cm^{-3}$ and 1E20 $cm^{-3}$ according to a specific embodiment.

In certain embodiments, a p-contact layer positioned on top of and is formed overlying the p-type cladding layer. The p-contact layer may comprise a gallium and nitrogen containing layer such as GaN doped with a p-dopant such as Mg at a level ranging from 1E19 $cm^{-3}$ to 1E22 $cm^{-3}$.

Several more detailed embodiments, not intended to limit the scope of the claims, are described below.

According to the present invention, techniques related to providing a high performance laser diode on a very low defect density gallium and nitrogen containing substrate are provided. More particularly, the present invention provides a method of producing a laser diode operating with extremely high case temperatures such as above 80° C. or above 100° C. or with very high current density such as above 14 kA/$cm^2$ or above 20 kA/cm2 while still maintaining a long lifetime. A key component to this invention is the use of a high-quality free standing gallium and nitrogen containing substrate containing less than about $10^5$ $cm^{-2}$, $10^4$ $cm^{-2}$, $10^3$ $cm^{-2}$, or less than $10^2$ $cm^{-2}$ along with a low stacking fault density of less than $10^4$ $cm^1$, $10^2$ $cm^1$, or $10^0$ $cm^{-1}$. There are several substrate synthesis technologies that are potentially capable of achieving such low defect density. Such high quality substrate synthesis techniques include, but are not limited to, ammonobasic, ammonoacidic, ammonothermal, hydride vapor phase epitaxy technique, some combination, and others. In other embodiments, the present invention provides methods suitable for synthesis of polycrystalline nitride materials, but it can be recognized that other crystals and materials can also be processed. Such crystals and materials include, but are not limited to, GaN, AN, InN, InGaN, AlGaN, and AlInGaN, and others for manufacture of bulk or patterned substrates. Such bulk or patterned substrates can be used for a variety of applications including optoelectronic devices, laser diodes, light emitting diodes, solar cells, photoelectrochemical water splitting and hydrogen generation devices, photodetectors, integrated circuits, and transistors, among other devices.

Approximating language, as used herein throughout the specification and claims, may be applied to modify any quantitative representation that could permissibly vary without resulting in a change in the basic function to which it may be related. Accordingly, a value modified by a term such as "about" may not to be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

The metal of the metal nitride may include a group III metal. Suitable metals may include one or more of aluminum, gallium, or indium. The "one or more" refers to combination of metals in the metal nitride, and may include compositions such as aluminum gallium nitride (AlGaN), and the like. As used herein, the term "gallium nitride" will be used as an illustrative example of a metal nitride, but it is understood that other group III metal nitrides are also contemplated.

A metal nitride composition may contain one or more impurities. As used herein, and as is commonly used in the art, the term "impurity" refers to a chemical species that is distinct from the group III metal nitride that constitutes the majority composition of the single-crystal or polycrystalline metal nitride. Several classes of impurities may be distinguished, with respect to chemistry, atomic structure, intent, and effect. Impurities will generally comprise elements distinct from nitrogen, aluminum, gallium, and indium, including oxygen, carbon, halogens, hydrogen, alkali metals, alkaline earth metals, transition metals, and main block elements. The impurity may be present in a number of forms, with different atomic structure. In some cases, the impurity is present as an isolated atom or ion within the crystalline lattice of the group III metal nitride, for example, as a substitutional or interstitial impurity. In other cases, the impurity is present in a distinct phase, for example, as an inclusion within an individual group III metal nitride grain or within a grain boundary of the group III metal nitride. The impurity may be deliberately added, to enhance the properties of the group III metal nitride in some way, or may be unintentional. Finally, the impurity may or may not have a significant effect on the electrical, crystallographic, chemical, or mechanical properties of the group III metal nitride.

As used herein, and as is commonly used in the art, the term "dopant" refers to an impurity that is atomically dispersed within the group III metal nitride, for example, as a substitutional or interstitial impurity, and is typically added intentionally. With regard to dopants and dopant precursors (collectively "dopants" unless otherwise indicated), the electrical properties of the group III metal nitride composition may be controlled by adding one or more of such dopants to the above composition during processing. The dopant may also provide magnetic and/or luminescent properties to the group III metal nitride composition. Suitable dopants may include one or more of s or p block elements, transition metal elements, and rare earth elements. Suitable s and p block elements may include, for example, one or more of silicon, germanium, magnesium, or tin. Other suitable dopants may include one or more of transition group elements. Suitable transition group elements may include one or more of, for example, zinc, iron, or cobalt. Suitable dopants may produce an n-type material, a p-type material, or a semi-insulating material. In some embodiments, oxygen, whether added intentionally or unintentionally, also acts as a dopant.

Suitable dopant concentration levels in a single-crystal or polycrystalline composition may be greater than about $10^{10}$ atoms per cubic centimeter. In one embodiment, the dopant concentration may be in a range of from about $10^{10}$ atoms per cubic centimeter to about $10^{15}$ atoms per cubic centimeter, from about $10^{15}$ atoms per cubic centimeter to about $10^{16}$ atoms per cubic centimeter, from about $10^{16}$ atoms per cubic centimeter to about $10^{17}$ atoms per cubic centimeter, from about $10^{17}$ atoms per cubic centimeter to about $10^{18}$ atoms per cubic centimeter, from about $10^{18}$ atoms per cubic centimeter to about $10^{21}$ atoms per cubic centimeter, or greater than about $10^{21}$ atoms per cubic centimeter.

As used herein, the term "getter" refers to an impurity that is intentionally added and has a higher chemical affinity for an undesired impurity, for example, oxygen, than the principal metallic constituent of the composition, for example, gallium. The getter may become incorporated into a single-crystal or polycrystalline group III metal nitride in the form of an inclusion, for example, as a metal nitride, a metal halide, a metal oxide, a metal oxyhalide, or as a metal oxynitride. Examples of suitable getters include the alkaline earth metals, scandium, titanium, vanadium, chromium, yttrium, zirconium, niobium, the rare earth metals, hafnium, tantalum, and tungsten, and their nitrides and halides. In some embodiments, the getter impurity can act as both a getter and a dopant, such as magnesium. In other cases, the getter impurity atom has a larger atomic or covalent diameter than gallium and does not become incorporated as a dopant at sufficient levels to modify the electrical properties of the group III metal nitride significantly, and therefore functions predominantly or exclusively as a getter. The getter may be present in the polycrystalline group III metal nitride at a level greater than 100 ppm, from about 100 ppm to about 200 ppm, from about 200 ppm to about 500 ppm, from about 500 ppm to about 0.1%, from about 0.1% to about 0.2%, from about 0.2% to about 0.5%, from about 0.5% to about 2%, from about 2% to about 10%, or greater than 10%. Parts per million (ppm) and "%" refer to "by weight" unless otherwise indicated.

In other cases, impurities are unintended and/or undesirable inclusions in the single crystal or polycrystalline group III metal nitride, and may result from, for example, processing and handling. Other unintentional impurities may result from contaminants in raw materials. Some unintentional impurities may be more closely associated with select raw materials. In some embodiments, the unintentional impurity includes oxygen present as a substitutional impurity, or dopant, in the single crystal or polycrystalline group III metal nitride at higher than the desired level. In other embodiments, the unintentional impurity includes oxygen present as a group III oxide inclusion, for example, $Ga_2O_3$, $Al_2O_3$, and/or $In_2O_3$. The unintentional oxygen impurity may originate from residual oxygen in the metal raw material, from moisture or $O_2$ present as an impurity in the gaseous raw materials used in the synthesis process, from moisture generated from outgassing of the reactor components during the synthesis process, or from an air leak in the reactor. In one embodiment, the oxygen content present as $Ga_2O_3$ or as a substitutional impurity within gallium nitride may be less than about 10 parts per million (ppm). In another embodiment, the oxygen content present as $Ga_2O_3$ or as a substitutional impurity within gallium nitride may be in a range of from about 10 parts per million to about 3 parts per million, from about 3 parts per million to about 1 part per million, from about 1 part per million to about 0.3 parts per million, from about 0.3 part per million to about 0.1 parts per million, or less than about 0.1 part per million.

In one embodiment using an ammonothermal technique, a high-quality gallium nitride or metal nitride crystal or wafer may be manufactured cost-effectively by the following method.

The ammonothermal technique is a solvothermal process that employs a polar solvent of inorganic or organic nature under subcritical or even supercritical conditions to dissolve and re-crystallize a polar material. The polar solvent, water for the hydrothermal and ammonia for the ammonothermal technique, forms metastable products with the solute. A mineralizer is used to increase the solubility of the solute. By containing the reaction to a closed system the exchange of matter with ambient is impossible and the solvent takes over a supercritical state and lead to improved solubility. The solvothermal crystal growth technology is attractive due to its near thermodynamic equilibrium process which can generate a high crystallinity, potential for high throughput, and environmentally benign conditions for production. Zinc oxide (ZnO) is the first semiconducting crystal grown at industrial scale by a solvothermal technique for the purpose of wafer production.

The ammonothermal technique uses $NH_3$ as solvent to fabricate gallium and nitrogen containing crystals such as GaN. For the case of GaN, an autoclave apparatus is loaded with GaN feedstock, mineralizer, a baffle plate to design a temperature gradient, and seed crystals mounted on a holder. After sealing the autoclave and flushing with high purity nitrogen gas the two or more heaters assembled around the autoclave are heated to create a desired temperature profile. A typical heating cycle includes the ramping to temperature, dwelling at temperature for crystal growth, and cooling down. During the growth phase, the dissolved nutrient is transported to the region of crystallization, where it recrystallizes on seed crystals or through self-seeding. The type of the mineralizer used determines the main type of the ammonothermal approach, with respective advantages and disadvantages. The mineralizers are generally divided into three groups: i) basic mineralizer, which introduces NH−2 ions to the solution; ii) acidic, which introduces NH+4 ions; and iii) neutral, which does not introduce either of them. The ammonobasic growth technique is conducted by transporting the mass from high- to low temperature zones. This technique is attractive due to its lower dissolution density due to solubilizing in the higher temperature zone, potential for reduced contamination or background due to the lower recrystallization temperature, lower probability for cubic formation; and absence of disastrous effect of the basic solution on the autoclave materials. The ammonoacidic approach requires special, usually costly, Au or Pt liners, and still the safety operation remains problematic.

The use of basic mineralizers in supercritical ammonia causes a retrograde solubility of GaN. A slightly increased temperature in the GaN crystal growth zone of the autoclave is required to trigger nucleation on a given GaN seed crystal. The chemistry of the solution during the whole cycle can be divided into three parts of including heating, crystal growth, and cooling. Each cycle has certain characteristics in its temperature-pressure scheme; consequently, the chemical equilibrium differs. Cooling down to room temperature simply reduces the thermal stress of the grown crystals. Heating determines the degree of supersaturation during the formation of stable nuclei to initiate growth and dictate the quality of nucleation, and hence the structural quality of the crystal to be grown.

The autoclave is especially designed to handle very high pressures and temperatures. The general trend in the growth technology industry is to reduce temperature and pressure of a process as much as possible to generate a more economic autoclave technology. Typical dimensions for an autoclave are a few millimeter inner diameter and 15 cm to 40 cm inner length for research purposes, and 10 cm inner diameter and several meters inner length for production type autoclaves.

One, two, three, four, five, ten, or more high-quality gallium nitride seed crystals or plates may be provided in the autoclave. The seed plates may have a minimum lateral dimension of at least one centimeter. In some embodiments, the seed plates have a maximum lateral dimension of at least two centimeters and a minimum lateral dimension of at least one centimeter. In other embodiments, the seed plates have minimum lateral dimensions of at least three centimeters, at least four centimeters, at least five centimeters, at least six centimeters, at least eight centimeters, or at least ten centimeters. In some embodiments, the seed plates are bulk single crystals of gallium nitride. In some embodiments the seed plates are prepared from crystals that were grown by hydride vapor phase epitaxy. In other embodiments, the seed plates are prepared from crystals that were grown ammonothermally. In still other embodiments, the seed plates are prepared from crystals that were grown from solution in a flux. In some embodiments, the dislocation density at the large-area surfaces of the seed plates is less than about $10^6$ cm$^{-2}$. In some embodiments, the dislocation density at the large-area surfaces of the seed plates is less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

In one specific embodiment, the orientation of the large-area surfaces of the seed plates is within about 5 degrees, within about 2 degrees, within about 1 degree, within about 0.5 degree, within about 0.2 degree, or within about 0.1 degree of a {10 –10} m plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a (0 0 0±1) c plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a {1 1 –2 0} a plane. In some embodiments, the seed plate has a semi-polar large-surface orientation, which may be designated by (hkil) Bravais-Miller indices, where i=–(h+k), l is nonzero and at least one of h and k are nonzero. In a specific embodiment, the orientation of the large-area surfaces of the seed plates is within about 5 degrees, within about 2 degrees, within about 1 degree, within about 0.5 degree, within about 0.2 degree, or within about 0.1 degree of {1 –1 0±1}, {1 –1 0±2}, {1 –1 0±3}, {3 0 –3±1}, {2 0 –2±1}, {3 0 –3±2} or {1 1 –2±2}.

A polycrystalline group III metal nitride or gallium nitride nutrient material may be provided, as described in U.S. Patent Application Ser. No. 61/122,332, which is hereby incorporated by reference in its entirety. The polycrystalline group III metal nitride may have an oxygen content in the group III metal nitride material provided as a group III metal oxide or as a substitutional impurity within a group III metal nitride that is less than about 10 parts per million (ppm), less than about 1 ppm, or less than about 0.1 ppm. The polycrystalline group III metal nitride may comprise a getter at a level of at least 100 ppm with respect to the group III metal, where the getter is selected from at least alkaline earth metals, scandium, titanium, vanadium, chromium, yttrium, zirconium, niobium, rare earth metals, hafnium, tantalum, and tungsten. The polycrystalline group III metal nitride may further comprise a compensatory dopant, at a level between about $10^{14}$ cm$^{-3}$ and about $10^{20}$ cm$^{-3}$, where the compensatory dopant is selected from at least V, Cr, Mo, W, Mn, Re, Fe, Ru, Os, Co, Rh, Ir, Ni, Pd, Pt, Cu, Ag, Au, Zn, Cd and Hg. The compensatory dopant may be formed in the polycrystalline group III metal nitride by addition of at least one of V, Cr, Mo, W, Mn, Re, Fe, Ru, Os, Co, Rh, Ir, Ni, Pd, Pt, Cu, Ag, Au, Zn, Cd and Hg to gallium or a group III metal prior or during the process whereby the gallium or group III metal is reacted with ammonia in the presence of a hydrogen halide to form the polycrystalline metal nitride.

The polycrystalline group III metal nitride may be placed in a basket, which is then placed in an autoclave or a capsule, as described in U.S. Pat. Nos. 6,656,615, 7,125,453, and 7,078,731 and in U.S. Application Publication No. 2009/0301388, each of which is incorporated by reference in its entirety. Ammonia and a mineralizer, for example, at least one of an alkali metal, amide, nitride, or azide, an alkaline earth metal, amide, nitride, or azide, ammonium fluoride, ammonium chloride, a group III metal fluoride, a group III metal chloride, or a reaction product between two more of a group III metal, ammonia, HF, and HCl are also placed in the autoclave or capsule.

In some embodiments a getter is also placed in the autoclave or capsule. A liner may be present within the autoclave to reduce or eliminate reaction of the growth solution with the autoclave walls. The liner may comprise a precious metal such as at least one of silver, gold, platinum, palladium, iridium, ruthenium, and rhodium. The added getter may be provided in addition to a getter composition that may be present in the polycrystalline group III nitride. The added getter may comprise at least one of alkaline earth metals, Sc, Ti, V, Cr, Y, Zr, Nb, Hf, Ta, W, rare earth metals, and their nitrides, halides, oxynitrides, oxyhalides, amides, imides, and azides. In one specific embodiment, at least a portion of the getter is added in the form of a metal and at least a portion of the mineralizer is added as an azide in such a ratio that the hydrogen generated by reaction of the getter metal with ammonia and the nitrogen generated by decomposition of the azide are present in a ratio of approximately 3:1, as described in U.S. Pat. No. 8,323,405, which is incorporated by reference in its entirety. The added getter may be useful for removing unintentional impurities, for example, oxygen, that are present in the mineralizer or other raw material. In one set of embodiments, the mineralizer comprises an alkali metal and the getter comprises a nitride, imide, or amide of Be, Mg, Ca, Sr, Ba, Sc. Y, a rare earth metal, Ti, Zr, Hf, V, Nb, Ta, Cr, Mo, or W. In another set of embodiments, the mineralizer comprises Cl and the getter comprises a nitride, chloride, oxynitride, or oxychloride of Sc, Cr, Zr, Nb, Hf, Ta, or W. In still another set of embodiments, the mineralizer comprises F and the getter comprises a nitride, fluoride, oxynitride, or oxyfluoride of Cr, Zr, Nb, Hf, Ta, or W.

After all the raw materials have been added to the autoclave or capsule, the autoclave or capsule is sealed.

The capsule, if employed, is then placed within a suitable high pressure apparatus. In one embodiment, the high pressure apparatus comprises an autoclave, as described by U.S. Pat. No. 7,335,262, which is incorporated by reference herein in its entirety. In another embodiment, the high pressure apparatus is an internally heated high pressure apparatus, as described in U.S. Pat. No. 7,125,453, U.S. Publication No. 2006/0177362 A1 and U.S. Pat. No. 8,097,081, each of which is incorporated by reference in its entirety. The polycrystalline group III metal nitride and seed crystals are then processed in supercritical ammonia at a temperature greater than about 400 degrees Celsius and at a pressure greater than about 0.2 gigaPascal (GPa), during which at least a portion of the polycrystalline group III metal nitride is etched away and recrystallized onto at least one group III nitride crystal with a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 0.3 GPa, greater than about 0.4 GPa, greater than about 0.5 GPa, greater than about 0.6 GPa, greater than about 0.7 GPa, or greater than about 0.8 GPa.

Residual getter in the polycrystalline group III metal nitride may be released into solution gradually, as the polycrystalline group III metal nitride is etched. Once in solution, the getter may react to form a getter metal nitride, amide, or halide. The getter may also be chemically bound to oxygen. The getter may remove residual oxygen in the supercritical ammonia solution, enabling growth of group III nitride single crystals with improved purity and transparency, enabling semi-insulating character at lower concentrations of the compensatory dopant.

The ammonothermally-grown crystalline group III metal nitride may be characterized by a wurtzite structure substantially free from any cubic entities and have an optical absorption coefficient of about 10 $cm^{-1}$, 5 $cm^{-1}$, 2 $cm^{-1}$, 1 $cm^{-1}$, or 0.5 $cm^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ $cm^{-3}$, greater than $10^{15}$ $cm^{-3}$, or greater than $10^{16}$ $cm^{-3}$ of at least one of Li, Na, K, Rb, Cs, Mg, Ca, F, and Cl, and an optical absorption coefficient of about 10 $cm^{-1}$, 5 $cm^{-1}$, 2 $cm^{-1}$, 1 $cm^{-1}$, or 0.5 $cm^{-1}$ and less at wavelengths between about 385 nanometers and about 750 nanometers. The optical absorption coefficient of the ammonothermally-grown crystalline group III metal nitride at wavelengths between about 395 nm and about 460 nm may be less than about 10 $cm^{-1}$, less than about 5 $cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

By growing for a suitable period of time, the ammonothermally-grown crystalline group III metal nitride may have a thickness of greater than about 1 millimeter and a length, or diameter, greater than about 20 millimeters. In certain embodiments, the length is greater than about 50 millimeters or greater than about 100 millimeters. After growth, the ammonothermally-grown crystalline group III metal nitride may be sliced, polished, and chemical-mechanically polished according to methods that are known in the art to form one or more wafers or crystalline substrate members. In certain embodiments, the root-mean-square surface roughness of the at least one wafer or crystalline substrate member is less than about one nanometer, for example, as measured by atomic force microscopy over an area of at least about 10 micrometers by 10 micrometers.

The ammonothermally-grown crystalline group III metal nitride crystal, or a wafer sliced and polished from the crystal, may be used as a substrate for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

In certain embodiments, the high quality substrate can be synthesized by the common hydride vapor phase epitaxy (HVPE) method. This is an attractive technique since it enables the production of high-quality material at relatively high growth rates due to a high surface migration of the halide species. Thus, HVPE is considered to be an efficient method to obtain thick gallium and nitrogen containing layers that can serve as substrates for subsequent epitaxial and process steps to fabricate device structures. The low pressure and low temperature process conditions used in HVPE relative to other substrate synthesis techniques makes it extremely promising since these conditions along with high growth rate can drive low costs.

The physics and chemistry of HVPE growth are relatively well understood. In general, the HVPE process for forming III-nitride layers consists of forming chloride gas of the group III metal at relatively lower growth temperature and then a growth reaction between the chloride metal and ammonia to form the nitride film at higher temperature. The growth temperature is typically in the range of 950° C. to 1100° C. At least two temperature zone reactors are needed in the reactor, which can be configured in a horizontal or vertical orientation. Typically more temperature zones can enable a higher flexibility and control over the growth process.

The HVPE technique can produce n-type, p-type, and semi-insulating material depending upon the intentional dopants introduced to the reactor during growth, but the material generally contains unintentional n-type background doping with silicon and oxygen. Such unintentional dopants can originate from the quartz parts within the reactor and/or from the process gases. Intentional n-type doping species include, but are not limited to, silicon, oxygen, germanium, and tin, but are most commonly silicon and oxygen. Example precursors used for silicon are silane or disilane. Zinc can be used as a p-type dopant and iron can be incorporated to achieve a semi-insulating layer.

Optimization of the HVPE growth process can be rather complex due to the large number of input parameters and design space associated with the multidisciplinary nature of crystal growth technology. To name a few parameters that must be considered there is pressure profile, temperature profile, choice of gas species, flow of gas species, and VIII ratio. Beyond these growth parameters, the seed quality is of paramount importance since once the growth process is fully optimized the resulting crystal quality will be limited by the quality of the seed. Therefore, a promising method to achieve an extremely high quality crystals using an efficient production method is to perform HVPE on a very high quality seed that has been generated by a different growth technique.

In certain embodiments for synthesis of a high quality substrate more than one general substrate synthesis technique is combined to form a so called "hybrid substrate synthesis technique". Such a hybrid substrate synthesis technique can have many variations and combinations. Examples of such a combination are to combine an ammonothermal technique and an HVPE technique. The ammonothermal process can be utilized to generate a very high quality seed with very low defect densities of less than 1E5 $cm^{-2}$ dislocations, less than 1E0 $cm^{-1}$ stacking faults, and can be substantially free from any internal stresses resulting from formation on a foreign substrate. This seed can then be placed in an HVPE reactor and thick gallium and nitrogen containing layers can be generated. These thick layers can then be wafered for use as substrates for epitaxial growth and device formation or be recycled as high quality seeds for subsequent HVPE runs.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

In this example, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration.

In other embodiments, the present laser device can be configured in a variety of applications. Such applications include laser displays, metrology, communications, health care and surgery, information technology, and others. As an example, the present laser device can be provided in a laser display such as those described in U.S. Pat. No. 8,427,590, which is incorporated by reference in its entirety.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
a gallium and nitrogen containing substrate member having a semipolar crystalline surface region, the substrate member having a thickness of less than 750 microns and characterized by a surface dislocation density of less than $10^5$ cm$^{-2}$ and a stacking fault density of less than $10^3$ cm$^{-1}$;
an offcut orientation characterizing the surface region;
a gallium and nitrogen containing n-type cladding layer overlying the surface region, the n-type cladding layer having a thickness and an n-type doping level of 5E16 cm$^{-3}$ to 6E18 cm$^{-3}$;
an n-side separate confining heterostructure (SCH) waveguide layer overlying the n-type cladding layer, the n-side SCH waveguide layer comprising at least gallium, indium, and nitrogen with a molar fraction of In of greater than 1% and having a thickness greater than 15 nm;
a multiple quantum well active region overlying the n-side SCH waveguide layer, the multiple quantum well active region comprising one or more, 1.5 nm to 8.5 nm thick InGaN quantum wells separated by gallium and nitrogen containing barrier layers;
a p-type gallium and nitrogen containing cladding layer overlying the multiple quantum well active region, the p-type cladding layer having a thickness from 200 nm to 1500 nm with a p-type doping level of 5E16 cm$^{-3}$ to 5E19 cm$^{-3}$;
a p++ gallium and nitrogen containing contact layer overlying the p-type cladding layer, the p++ gallium and nitrogen containing contact layer having a thickness greater than 5 nm with a p-type doping level of 1E19 cm$^{-3}$ to 1E22 cm$^{-3}$;
at least one waveguide member overlying the p-type gallium and nitrogen containing cladding layer, the at least one waveguide member being aligned substantially in a projection of the c-direction and comprising a first end and a second end;
a first facet formed on the first end; and
a second facet formed on the second end.

2. The device of claim 1, wherein the gallium and nitrogen containing substrate member is characterized by a surface dislocation density of less than $10^3$ cm$^{-2}$ and a stacking fault density of less than $10^2$ cm$^{-1}$; a surface dislocation density of less than $10^3$ cm$^{-2}$ and a stacking fault density of less than $10^0$ cm$^{-1}$; or a surface dislocation density of less than $10^2$ cm$^{-2}$ and a stacking fault density of less than $10^0$ cm$^{-1}$.

3. The device of claim 1, wherein the gallium and nitrogen containing substrate member is produced by a process selected from an ammonothermal process, an HVPE process, both an ammonothermal process and an HVPE process, and an ammonothermal process for generation of a seed to be used in a subsequent HVPE process.

4. The device of claim 1, wherein the gallium and nitrogen containing substrate member has a semipolar surface orientation characterized by a plane selected from a (30-3-1) plane, a (30-31) plane, a (20-2-1) plane, a (20-21) plane, a (30-3-2) plane, a (30-32) plane, and a semipolar surface orientation characterized by an offcut selected from an offcut of +/−5 degrees toward a c-plane and an offcut of +/−10 degrees toward an a-plane.

5. The device of claim 1, wherein,
the optical device is a laser diode configured to operate in a wavelength regime selected from a blue wavelength region of 425 nm to 470 nm and a green wavelength regime of 500 nm and 550 nm; and
the laser diode is operable at a case temperature of over 70° C. with a mean time to failure of greater than 20 khrs or greater than 40 khrs.

6. The device of claim 5, wherein the laser diode is operable at a case temperature of over 100° C. with a mean time to failure of greater than 10 khrs or greater than 20 khrs.

7. The device of claim 5, wherein the laser diode is operable at a current density of over 20 kA/cm$^2$ with a mean time to failure of greater than 10 khrs or greater than 30 khrs.

8. The device of claim 5, wherein the laser diode device is operable at a current density of over 35 kA/cm$^2$ with a mean time to failure of greater than 10 khrs.

9. The device of claim 1, wherein the first facet and second facet are cleaved facets and formed using a scribing and breaking process.

10. The device of claim 1, wherein the first facet and second facet are etched facets and formed using a dry etching process.

11. An optical device comprising:
a gallium and nitrogen containing substrate member having a semipolar crystalline surface region, the substrate member having a thickness of less than 750 microns and a surface dislocation density of less than $10^3$ cm$^{-2}$ and a stacking fault density of less than $10^1$ cm$^{-1}$;

an offcut orientation characterizing the surface region;
a gallium and nitrogen containing n-type cladding layer overlying the surface region, the n-type cladding layer having a thickness and an n-type doping level of 5E16 $cm^{-3}$ to 6E18 $cm^{-3}$;
an n-side separate confining heterostructure (SCH) waveguide layer overlying the n-type cladding layer, the n-side SCH waveguide layer comprising at least gallium, indium, and nitrogen with a molar fraction of In of greater than 1% and having a thickness greater than 15 nm;
a multiple quantum well active region overlying the n-side SCH waveguide layer, the multiple quantum well active region comprising two or more, 1.0 nm to 8.5 nm thick InGaN quantum wells separated by gallium and nitrogen containing barrier layers;
a p-type gallium and nitrogen containing cladding layer overlying the multiple quantum well active region, the p-type cladding layer having a thickness from 200 nm to 1500 nm with a p-type doping level of 5E16 $cm^{-3}$ to 5E19 $cm^{-3}$;
a p++ gallium and nitrogen containing contact layer overlying the p-type cladding layer, the p++ gallium and nitrogen containing contact layer having a thickness greater than 5 nm with a p-type doping level of 1E19 $cm^{-3}$ to 1E22 $cm^{-3}$;
at least one waveguide member overlying the p-type gallium and nitrogen containing cladding layer, the at least one waveguide member being aligned substantially in a projection of the c-direction and comprising a first end and a second end;
a first facet formed on the first end; and
a second facet formed on the second end.

12. The device of claim 11, wherein the gallium and nitrogen containing substrate member has a surface dislocation density of less than $10^2$ $cm^{-2}$ and a stacking fault density of less than $10^0$ $cm^{-1}$ or w a surface dislocation density of less than $10^1$ $cm^{-2}$ and a stacking fault density of less than $10^0$ $cm^{-1}$.

13. The device of claim 11, wherein the gallium and nitrogen containing substrate member is produced by a process selected from an ammonothermal process, an HVPE process, and both an ammonothermal process and an HVPE process.

14. The device of claim 11, wherein the gallium and nitrogen containing substrate member is produced by an ammonothermal process for generation of a seed to be used in a subsequent HVPE process.

15. The device of claim 11, wherein the gallium and nitrogen containing substrate member has a semipolar surface orientation characterized by a plane selected from a (30-3-1) plane, a (30-31) plane, a (20-2-1) plane, a (20-21) plane, a (30-3-2) plane, (30-32) plane; and a semipolar surface orientation characterized by an offcut selected from an offcut of +/−5 degrees toward a c-plane and an offcut of +/−10 degrees toward an a-plane.

16. The device of claim 11, wherein the optical device is a laser diode configured to operate in a wavelength regime selected from a blue wavelength regime of 425 nm to 470 nm and a green wavelength regime of 500 nm to 550 nm.

17. The device of claim 16, wherein the laser diode is operable at a case temperature of over 70° C. with a mean time to failure of greater than 20 khrs or greater than 40 khrs.

18. The device of claim 16, wherein the laser diode is operable at a case temperature of over 100° C. with a mean time to failure of greater than 10 khrs or greater than 20 khrs.

19. The device of claim 16, wherein the laser diode is operable at a current density of over 20 kA/$cm^2$ with a mean time to failure of greater than 10 khrs or greater than 30 khrs.

20. The device of claim 16, wherein the laser diode is operable at a current density of over 35 kA/$cm^2$ with a mean time to failure of greater than 10 khrs.

21. The device of claim 11, wherein the first facet and second facet are cleaved facets and formed using a scribing and breaking process.

22. The device of claim 11, wherein the first facet and second facet are etched facets and formed using a dry etching process.

23. An optical device comprising:
a gallium and nitrogen containing substrate member having a nonpolar crystalline surface region, the substrate member having a thickness of less than 750 microns and characterized by a surface dislocation density of less than $10^4$ $cm^{-2}$ and a stacking fault density of less than $10^1$ $cm^{-1}$;
an offcut orientation characterizing the surface region;
a gallium and nitrogen containing n-type cladding layer overlying the surface region, the n-type cladding layer having a thickness and an n-type doping level of 5E16 $cm^{-3}$ to 6E18 $cm^{-3}$;
an n-side separate confining heterostructure (SCH) waveguide layer overlying the n-type cladding layer, the n-side SCH waveguide layer comprising at least gallium, indium, and nitrogen with a molar fraction of In of greater than 1% and having a thickness greater than 15 nm;
a multiple quantum well active region overlying the n-side SCH waveguide layer, the multiple quantum well active region comprising two or more, 1.5 nm to 10 nm thick InGaN, quantum wells separated by gallium and nitrogen containing barrier layers;
a p-type gallium and nitrogen containing cladding layer overlying the multiple quantum well active region, the p-type cladding layer having a thickness from 200 nm to 1500 nm with a p-type doping level of 5E16 $cm^{-3}$ to 5E19 $cm^{-3}$;
a p++ gallium and nitrogen containing contact layer overlying the p-type cladding layer, the p++ gallium and nitrogen containing contact layer having a thickness greater than 5 nm with a p-type doping level of 1E19 $cm^{-3}$ to 1E22 $cm^{-3}$;
at least one waveguide member overlying the p-type gallium and nitrogen containing cladding layer, the at least one waveguide member being aligned substantially in a c-direction and comprising a first end and a second end;
a first facet formed on the first end; and
a second facet formed on the second end.

24. The device of claim 23, wherein the gallium and nitrogen containing substrate member has a surface dislocation density of less than $10^3$ $cm^{-2}$ and a stacking fault density of less than $10^1$ $cm^{-1}$; or a surface dislocation density less than $10^2$ $cm^{-2}$ and a stacking fault density of less than $10^0$ $cm^{-1}$.

25. The device of claim 23, wherein the gallium and nitrogen containing substrate member is produced by a process selected from an ammonothermal process, an HVPE process, or both an ammonothermal process and an HVPE process.

26. The device of claim 23, wherein the gallium and nitrogen containing substrate member is produced by an ammonothermal process for generation of a seed to be used in a subsequent HVPE process.

27. The device of claim 23, wherein,
the gallium and nitrogen containing substrate member has a nonpolar surface orientation characterized by an m-plane; a semipolar surface orientation characterized by an offcut selected from an offcut of +/−5 degrees toward a c-plane and an offcut of +/−10 degrees toward an a-plane; and the optical device is a laser diode configured to operate in a wavelength regime selected from a blue wavelength regime of 425 nm to 470 nm and a green wavelength regime of 500 nm to 550 nm.

\* \* \* \* \*